United States Patent
Nishiyama

(10) Patent No.: US 9,452,897 B2
(45) Date of Patent: Sep. 27, 2016

(54) COMPONENT MOUNTER

(71) Applicant: FUJI MACHINE MFG. CO., LTD., Chiryu-shi (JP)

(72) Inventor: Satoru Nishiyama, Nagoya (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 0 days.

(21) Appl. No.: 14/906,193

(22) PCT Filed: Jul. 25, 2013

(86) PCT No.: PCT/JP2013/070252
§ 371 (c)(1),
(2) Date: Jan. 19, 2016

(87) PCT Pub. No.: WO2015/011823
PCT Pub. Date: Jan. 29, 2015

(65) Prior Publication Data
US 2016/0159584 A1 Jun. 9, 2016

(51) Int. Cl.
*B25J 15/04* (2006.01)
*B65G 47/91* (2006.01)
*B25J 15/00* (2006.01)

(52) U.S. Cl.
CPC .......... *B65G 47/914* (2013.01); *B25J 15/0057* (2013.01); *B25J 15/04* (2013.01); *B65G 47/918* (2013.01)

(58) Field of Classification Search
CPC ....................................................... B25J 15/04
See application file for complete search history.

(56) References Cited

U.S. PATENT DOCUMENTS

| 4,794,689 | A | * | 1/1989 | Seno | ............... H05K 13/0452 29/743 |
| 4,979,284 | A | * | 12/1990 | McMurtry | ........... B25J 15/0491 483/1 |
| 5,197,846 | A | * | 3/1993 | Uno | ........................ B25J 15/04 414/731 |
| 5,784,778 | A | * | 7/1998 | Yoshida | ............. H05K 13/0408 29/743 |

(Continued)

FOREIGN PATENT DOCUMENTS

JP    2006-261325 A    9/2006

OTHER PUBLICATIONS

International Search Report issued Sep. 3, 2013 in PCT/JP13/70252 filed Jul. 25, 2013.

*Primary Examiner* — Gerald McClain
(74) *Attorney, Agent, or Firm* — Oblon, McClelland, Maier & Neustadt, L.L.P.

(57) ABSTRACT

A component mounter which exchangeably holds rotary head in head holding unit is provided with Z-axis driving mechanism that engages lever engaging piece of the nozzle holder, which performs component pickup and mounting operations, among multiple nozzle holders held on rotary head, from above and below with pushing down roller and Z-axis lever in order to lower and raise the nozzle holder. The interval between lever engaging piece of first holder that performs component pickup and mounting operation first and lever engaging piece of last holder that performs component pickup and mounting operation last is set at a wide interval at which engagement with Z-axis lever is released, and the wide interval between lever engaging piece of first holder and lever engaging piece of last holder is used as a passage through which Z-axis lever passes in an up/down direction when rotary head is attached/removed to/from head holding unit.

2 Claims, 8 Drawing Sheets

(56) References Cited

U.S. PATENT DOCUMENTS

| | | | | |
|---|---|---|---|---|
| 5,960,534 A * | 10/1999 | Yazawa | ............. | H05K 13/0413 29/743 |
| 6,101,707 A * | 8/2000 | Kano | ................. | H05K 13/0408 29/743 |
| 6,260,898 B1 * | 7/2001 | Kano | .................. | B25J 15/0616 29/743 |
| 6,678,944 B1 * | 1/2004 | Kawada | ............. | H05K 13/0408 29/743 |
| 7,401,401 B2 * | 7/2008 | Usui | .................. | H05K 13/0408 29/743 |
| 2006/0207090 A1 * | 9/2006 | Kawada | ............. | H05K 13/0408 29/743 |

* cited by examiner

COMPONENT MOUNTER

TECHNICAL FIELD

The present disclosure relates to a component mounter provided with a function to automatically exchange a rotary head that holds multiple suction nozzles which pick up a component.

BACKGROUND ART

With this type of component mounter, as disclosed in patent literature 1 (JP-A-2006-261325), in order to automatically exchange a rotary head that holds multiple suction nozzles according to the type (size, shape, weight, and so on) of a component to be picked up, the rotary head is held on a head holding section of the component mounter by negative pressure suction force. With the component mounter of patent literature 1, by raising/lowering the head holding section that holds the rotary head during component pickup and mounting operations, a revolving lever on the rotary head that moves based on the raising/lowering of the head holding section is engaged with a lever driving member on the component mounter to revolve the revolving lever such that a suction nozzle is raised/lowered.

CITATION LIST

Patent Literature

Patent Literature 1: JP-A-2006-261325

SUMMARY

With the configuration of the above patent literature 1, because it is necessary to raise/lower the head holding section to raise/lower the rotary head when raising/lowering a suction nozzle held on the rotary head during component pickup and mounting operations, for each of the multiple suction nozzles held on the rotary head to pick up a component, the raising/lowering operation of the rotary head must be repeated the same number of times as the quantity of the suction nozzles. Similarly, for each of the multiple suction nozzles holding a component to mount the component on a circuit board, the raising/lowering operation of the rotary head must be repeated the same number of times as the quantity of the suction nozzles. Thus, with the configuration of the above patent literature 1, increasing the speed of component pickup and mounting operations has reached a limit, which is an important recent technological problem in the field of component mounters.

Thus, an object of the present disclosure is to solve the above problem by providing a component mounter that is equipped with a function to automatically exchange a rotary head that holds multiple suction nozzles, and that supports faster component pickup and mounting operations.

To solve the above problem, the present disclosure is a component mounter comprising: a rotary head to which multiple nozzle holders that hold multiple suction nozzles which pick up a component are attached at predetermined intervals in a circumferential direction so as to be lowerable; a head holding unit that exchangeably holds the rotary head; a head moving device that moves the head holding unit; an R-axis driving mechanism, provided on the head holding unit, that revolves the multiple nozzle holders and the multiple suction nozzles together in a circumferential direction of the rotary head by rotating the rotary head; a lever engaging piece provided on each of the multiple nozzle holders; and a Z-axis driving mechanism that lowers and raises the suction nozzle held on the nozzle holder by lowering and raising the nozzle holder by engaging the lever engaging piece of, from among the multiple nozzle holders, the nozzle holder that is to perform component pickup and mounting operation from above and below with a pushing down member and a Z-axis lever; wherein the rotary head is rotated a predetermined angle each time by the R-axis driving mechanism so as to perform component pickup and mounting operations by lowering and raising the multiple nozzle holders in the order in which the nozzle holders are arranged using the Z-axis driving mechanism, the interval between the lever engaging piece of a first holder which is the nozzle holder which performs component pickup and mounting operations first and the lever engaging piece of a last holder which is the nozzle holder which performs component pickup and mounting operations last is set at an interval at which engagement with the Z-axis lever is released, and the interval between the lever engaging piece of the first holder and the lever engaging piece of the last holder is used as a passage through which the Z-axis lever passes in an up/down direction when the rotary head is attached/removed to/from the head holding unit, and wherein, except for the interval between the lever engaging piece of the first holder and the lever engaging piece of the last holder, the intervals between the lever engaging piece of each of the nozzle holders are set at an interval at which the engagement of the lever engaging piece with the Z-axis lever and the pushing down member is not released, and during component pickup and mounting operations the lowering and raising operations of the nozzle holder by the Z-axis driving mechanism and the rotating operation of the rotary head by the R-axis driving mechanism overlap.

With this configuration, because the rotary head can be rotated by a predetermined angle each time component pickup and mounting operations are performed such that the multiple nozzle holders are raised/lowered by the Z-axis driving mechanism in the order in which they are arranged, unlike with patent literature 1, it is not necessary to raise/lower the rotary head when performing component pickup and mounting operations. Further, because, except for the interval between the lever engaging piece of the first holder and the lever engaging piece of the last holder, the intervals between the lever engaging piece of each nozzle holder are set at an interval at which the engagement of the lever engaging piece with the Z-axis lever and the pushing down member is not released, it is possible during component pickup and mounter operations for the lowering and raising operations of the nozzle holders by the Z-axis driving mechanism and the rotating operation of the rotary head by the R-axis driving mechanism to overlap. By this, compared to a case in which the lowering and raising operations of the nozzle holder and the rotating operation of the rotary head do not overlap, the time interval between the raising and lowering operation of each nozzle holder is shortened, and it is possible to support faster component pickup and mounting operations. Also, because the interval between the lever engaging piece of the first holder and the lever engaging piece of the last holder is set at an interval at which engagement with the Z-axis lever is released, by using the interval between the lever engaging piece of the first holder and the lever engaging piece of the last holder as a passage through which the Z-axis lever passes in an up/down direction when the rotary head is attached/removed to/from the head holding unit, the rotary head can be attached/removed quickly without the need to move the Z-axis lever to a position where the Z-axis lever does not interfere with the lever engaging piece. Further, because a mechanism that moves the Z-axis lever to a position where the Z-axis lever does not interfere with the lever engaging piece is not required, there is a benefit that the configuration is not made more complex.

In this case, when the lever engaging piece of the nozzle is pushed down by the pushing down member of the Z-axis driving mechanism, because the rotary head is rotated by the overlapping operation such that the lever engaging piece moves with respect to the pushing down member, friction arises between the pushing down member and the lever engaging piece. In consideration of this point, it is good if the pushing down member is configured from a roller. By this, the friction between the pushing down member and the lever engaging piece during overlapping operation is greatly reduced, and as well as allowing smooth overlapping operation, durability is improved.

Also, when performing lowering operation of the first holder and raising operation of the last holder, the rotation of the rotary head may be stopped such that overlapping operation is not performed. In the process of moving the rotary head in the XY direction (horizontal direction) towards a point above the component pickup position or mounting position, if the rotary head is rotated such that the first holder is moved to a position at which the first holder is lowered by the Z-axis driving mechanism, it is not necessary to rotate the rotary head while lowering the first holder. Also, when performing raising operation of the last holder, because the component pickup and mounting operations of the first holder which is the adjacent holder to the last holder are already complete, it is not necessary to rotate the rotary head.

DETAILED DESCRIPTION

An embodiment of the disclosure is described below.

First, the configuration of component pickup/mounting device 10 of the component mounter is described.

Figure 1:
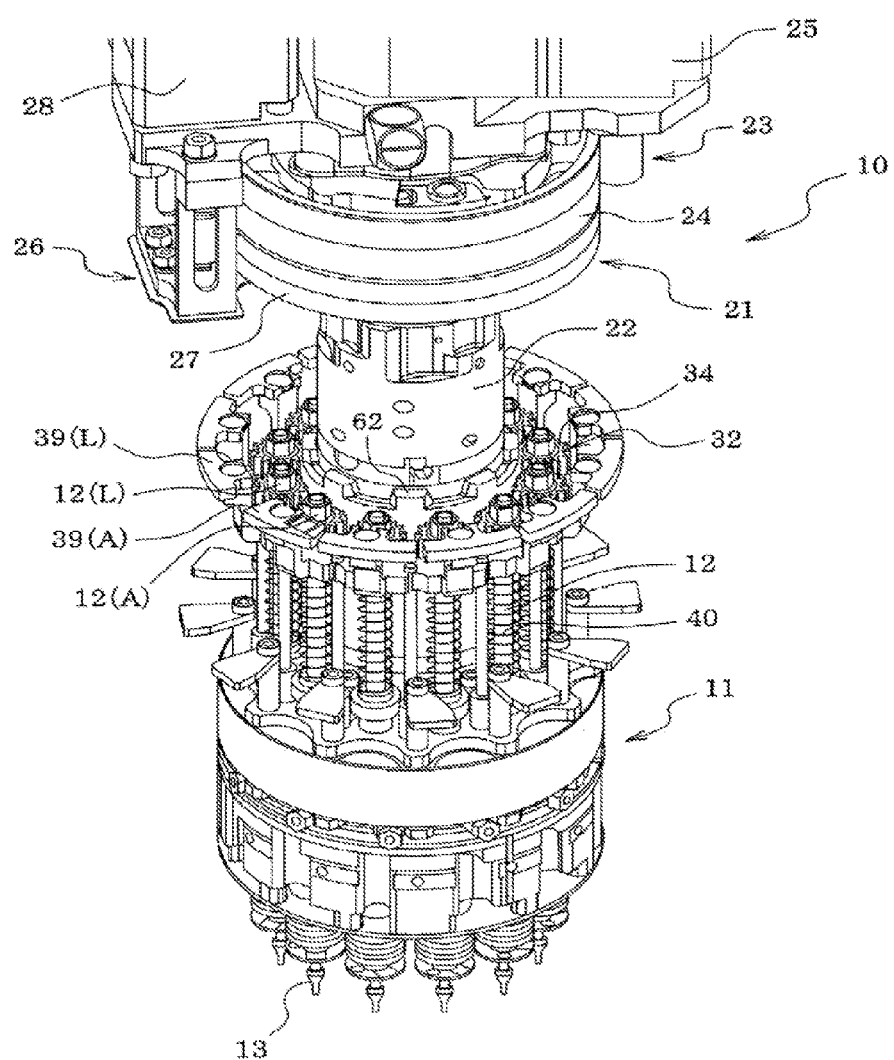
FIG. 1 is a perspective view showing a state where a rotary head is removed from a head holding unit of a component pickup/mounting device of an embodiment of the present invention.

As shown in FIG. 1, multiple nozzle holders 12 are lowerably held at predetermined intervals in a circumferential direction on rotary head 11 of component pickup/mounting device 10, and suction nozzles 13 which each pick up a component are exchangeably (detachably) engaged and held facing downwards on the lower section of each nozzle holder 12.

Figure 8:
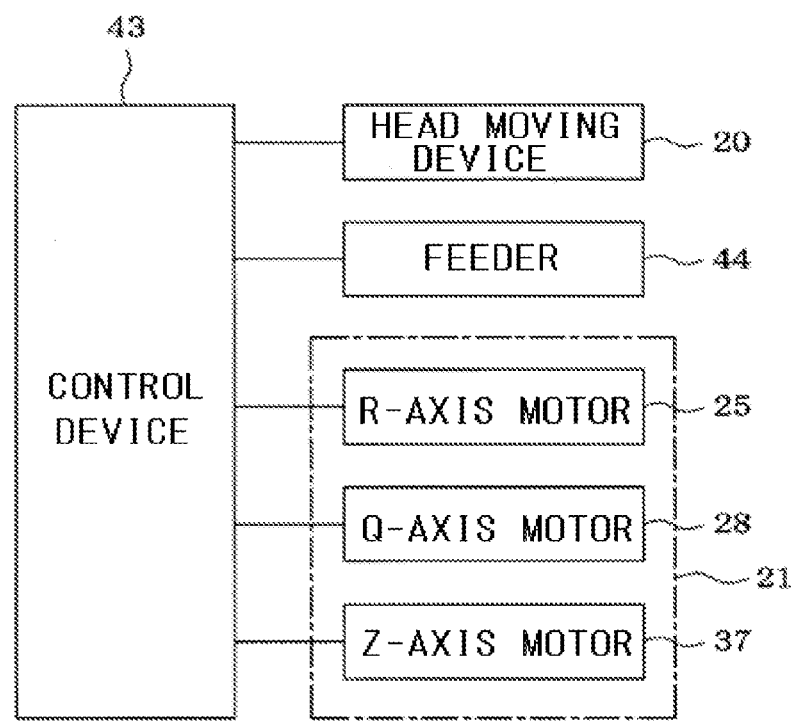
FIG. 8 is a block diagram showing the configuration of the control system of the component mounter.

Rotary head 11 is exchangeably (detachably) held on R axis 22 (refer to FIG. 2) extending downward of head holding unit 21 which is moved by head moving device 20 (refer to FIG. 8) of the component mounter. R-axis driving mechanism 23 (head rotating driving mechanism) which rotates R axis 22 is assembled on head holding unit 21. R-axis driving mechanism 23 rotates R-axis gear 24 (tooth surfaces not shown) fixed on the upper end of R axis 22 by R-axis motor 25 and rotates rotary head 11 around R axis 22, thus multiple nozzle holders 12 revolve in a circumferential direction of the rotary head 11 together with multiple suction nozzles 13.

Q-axis gear 27 (tooth surfaces not shown) which is a driving source of Q-axis driving mechanism 26 (nozzle rotating driving mechanism) is rotatably engaged with R axis 22, and the Q-axis gear 27 is rotated around R axis 22 by Q-axis motor 28.

Figure 2:
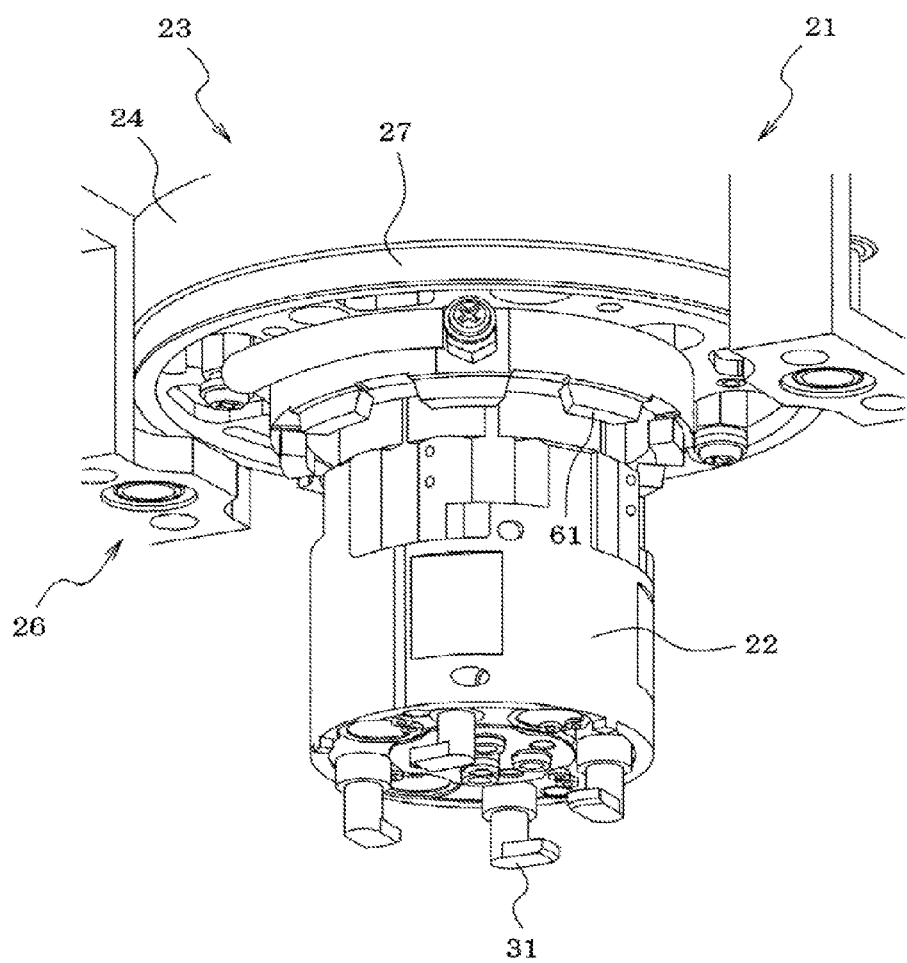
FIG. 2 is a perspective of the head holding unit of the component pickup/mounting device seen obliquely from below.

As shown in FIG. 2, on the lower section of R axis 22, multiple (for example, four) engaging members 31 are provided movably in the up/down direction in order to detachably engage and hold rotary head 11, and close to each engaging member 31, an air cylinder (not shown) which drives each engaging member 31 in the up/down direction is provided. Each engaging member 31 is respectively formed in an L shape or J shape and arranged at even intervals in a circumferential direction of R axis 22, and the direction of the claw section of each engaging member 31 is arranged so as to be facing in the same direction as the normal rotational direction (or the reverse rotational direction) of R axis 22.

On the other hand, rotary head 11 is provided with nozzle rotating gear mechanism 32 (refer to FIG. 3 and FIG. 4) for transmitting the rotational force of Q-axis gear 27 to each nozzle holder 12. With nozzle rotating gear mechanism 32, cylindrical gear 33 (tooth surfaces not shown) held on the upper side of rotary head 11 so as to be concentrically rotatable engages with small gear 34 attached to each nozzle holder 12, and Q-axis gear 27 of head holding unit 21 and cylindrical gear 33 of nozzle rotating gear mechanism 32 are linked by the engagement of the uneven sections of the ring-shaped clutch members 61 and 62 (refer to FIG. 2 and FIG. 3) such that rotation is transferable; thus, by rotating cylindrical gear 33 by Q-axis gear 27 so as to rotate small gear 34 of each nozzle holder 12, each nozzle holder 12 is rotated around an axis center line of each nozzle holder 12, thereby correcting the direction (angle) of each component held by each suction nozzle 13 held by each nozzle holder 12.

Figure 4:
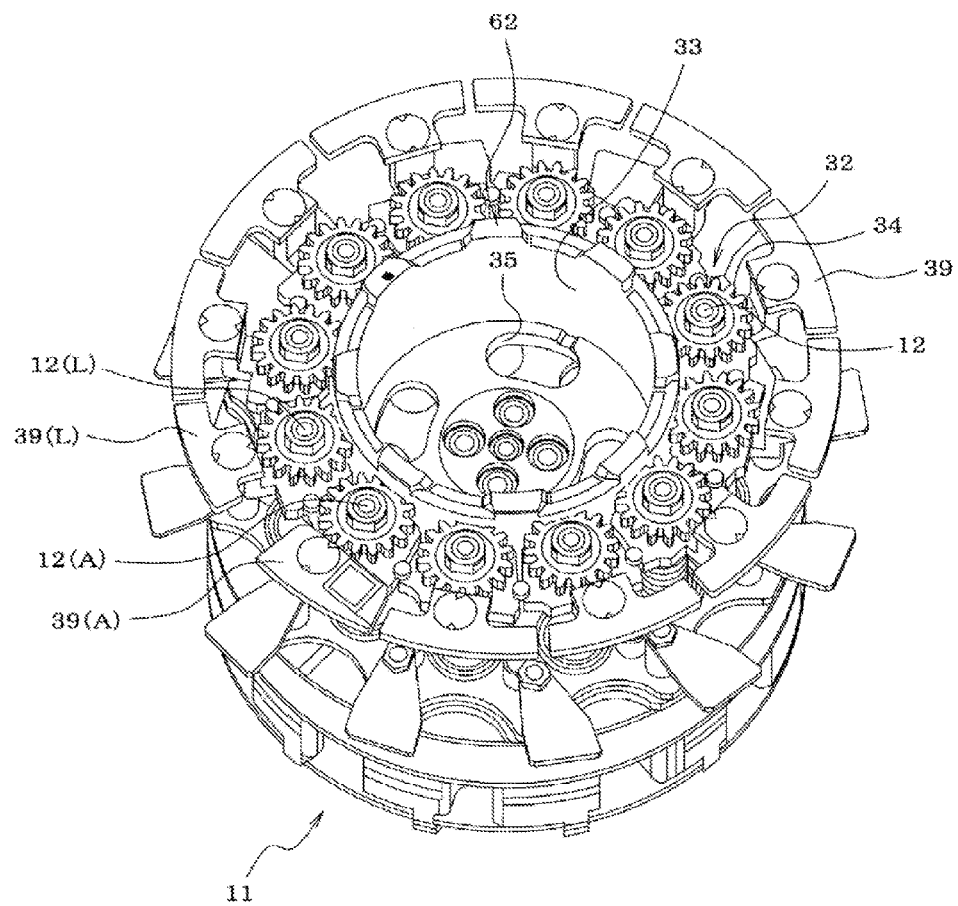
FIG. 4 is a perspective view of the upper side of the rotary head.

In order to insert R axis 22 of head holding unit 21 into cylindrical gear 33, the inner diameter of the cylindrical gear 33 is formed slightly larger than the outer diameter of R axis 22. As shown in FIG. 4, in positions inside cylindrical gear 33 on the upper surface of rotary head 11, multiple elongated engaging holes 35 for inserting through each engaging member 31 of R axis 22 are formed at even intervals in a circumferential direction.

A head loading section (not shown), on which rotary heads 11 used for exchange are loaded, is provided at a predetermined position within the movement range of head holding unit 21 of the component mounter. This head loading section is configured such that multiple types of rotary heads 11 can be loaded. When attaching rotary head 11 loaded on this head loading section to head holding unit 21, R axis 22 of head holding unit 21 is inserted into cylindrical gear 33 and each engaging member 31 of R axis 22 is inserted into the corresponding engaging hole 35 of rotary head 11, and R axis 22 is rotated by the rotation of R-axis gear 24 and each engaging member 31 is pulled up and held in a state with each engaging member 31 engaged with the corresponding engaging hole 35.

As well as a head loading section on which rotary heads 11 for exchange are loaded, a nozzle loading section (not shown), on which suction nozzles 13 used for exchange are loaded, is also provided on the component mounter, such that suction nozzles 13 held on nozzle holders 12 of rotary head 11 can be exchanged automatically.

Figure 5:
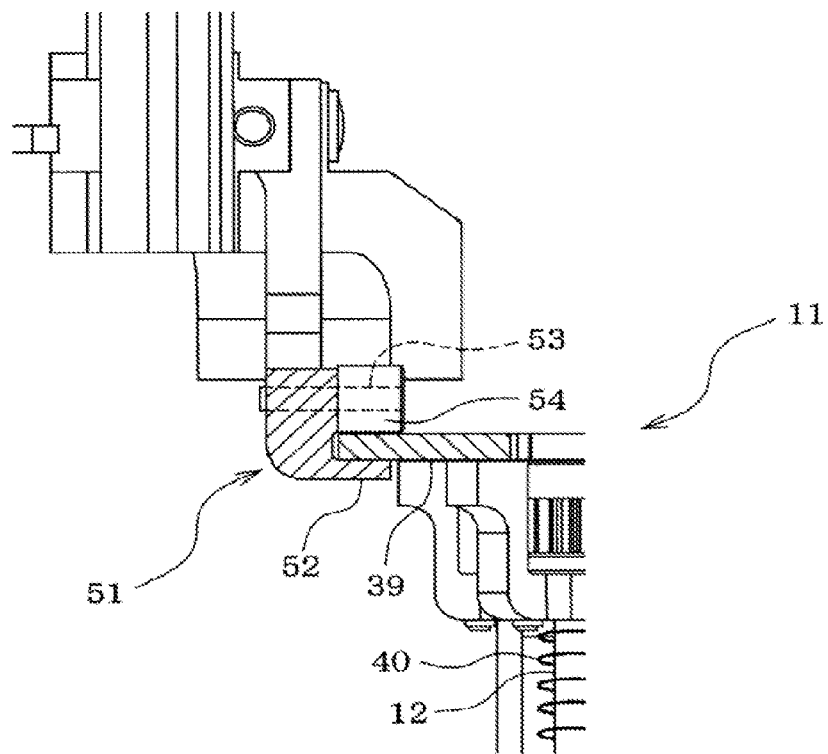
FIG. 5 is a front view showing the configuration of the main section of the Z-axis driving mechanism.

As well as R-axis driving mechanism 23 and Q-axis driving mechanism 26, Z-axis driving mechanism 51 (refer to FIG. 5 and FIG. 6), which has Z-axis motor 37 (refer to FIG. 8) as a driving source, is provided so as to move together with head holding unit 21. Z-axis driving mechanism 51 is provided with substantially L-shaped Z-axis lever 52 that is raised/lowered by Z-axis motor 37 during component pickup and mounting operations, and pushing down roller 54 (pushing down member) which is rotatably attached to Z-axis lever 52 via axis 53; a C-shaped engaging groove is formed by Z-axis lever 52 and pushing down roller 54 such that a lever engaging piece 39 fixed to an upper section of each nozzle holder 12 is engaged from above and below by pushing down roller 54 and Z-axis lever 52. In the present embodiment, for at least one of the engagement between pushing down roller 54 and lever engaging piece 39, and the engagement between Z-axis lever 52 and lever engaging piece 39, there is a small gap between the engaging members, however, lever engaging piece 39 may be sandwiched between pushing down roller 54 and lever engaging piece 39 such that there is no gap between each member. Axis 53 of pushing down roller 54 is held parallel to the diameter of rotary head 11, and pushing down roller 54 rolls on the upper surface of lever engaging piece 39 based on the rotation of rotary head 11 such that the friction resistance is reduced.

Figure 3:
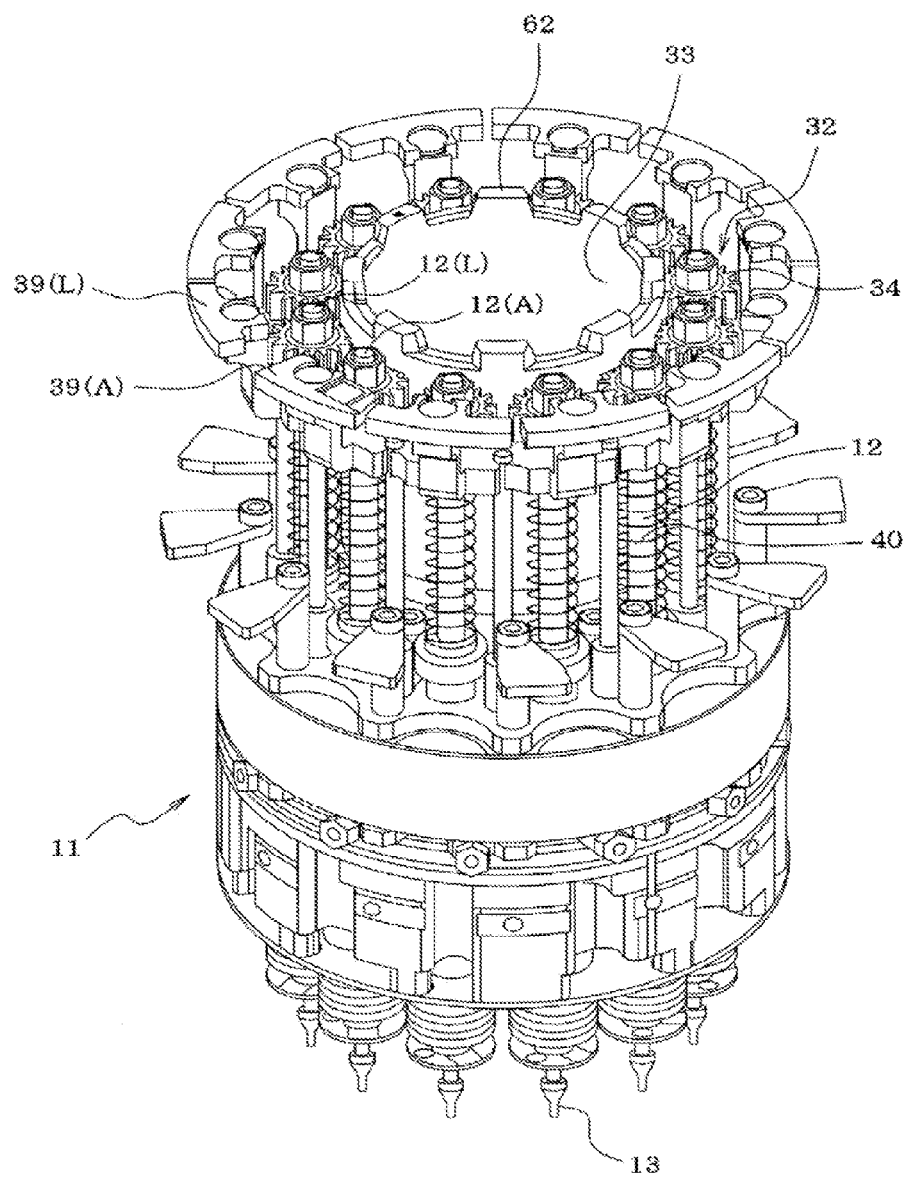
FIG. 3 is an overall perspective view of the rotary head.

As shown in FIG. 3, each nozzle holder 12 is biased upwards by spring 40 (spring member), and nozzle holders 12 released from pushing down roller 54 of Z-axis driving mechanism 51 are held at an upper position (the state shown in FIG. 3) by the pushing up force of spring 40. As shown in FIG. 3 and FIG. 4, in a state in which each nozzle holder 12 is held at the upper position, lever engaging pieces 39 of each nozzle holder 12 are held in a state arranged in a circle on a circumference concentric with rotary head 11.

When performing component pickup and mounting operations, rotary head 11 is rotated a predetermined angle each time by R-axis driving mechanism 23, and multiple nozzle holders 12 held on the rotary head 11 are raised/lowered by Z-axis driving mechanism 51 in the order in which they are arranged such that suction nozzles 13 held on each nozzle holder 12 are lowered and raised so as to perform component pickup and mounting operation.

In the present embodiment, the interval between lever engaging piece 39(A) of first holder 12(A) which is the nozzle holder 12 that performs component pickup and mounting operation first and lever engaging piece 39(L) of last holder 12(L) which is the nozzle holder 12 that performs component pickup and mounting operation last is set at an interval at which engagement with Z-axis lever 52 is released (an interval wider than Z-axis lever 52), and the wide interval between lever engaging piece 39(A) of first holder 12(A) and lever engaging piece 39(L) of last holder 12(L) is used as a passage through which Z-axis lever 52 passes in an up/down direction when rotary head 11 is attached/removed to/from head holding unit 21.

Further, except for the interval between lever engaging piece 39(A) of first holder 12(A) and lever engaging piece 39(L) of last holder 12(L), the intervals between lever engaging piece 39 of each nozzle holder 12 are set at an interval at which the engagement of lever engaging piece 39 with Z-axis lever 52 and pushing down roller 54 is not released (an interval narrower than Z-axis lever 52), such that during component pickup and mounter operations the lowering and raising operations of nozzle holders 12 by Z-axis driving mechanism 51 and the rotating operation of rotary head 11 by R-axis driving mechanism 23 overlap. However, when performing lowering operation of first holder 12(A) and raising operation of last holder 12(L), the rotation of rotary head 11 is stopped such that overlapping operation is not performed. In the process of moving rotary head 11 in the XY direction (horizontal direction) towards a point directly above the component pickup position or mounting position, if rotary head 11 is rotated such that first holder 12(A) is moved to a position at which the first holder 12(A) is lowered by Z-axis driving mechanism 51, it is not necessary to rotate rotary head 11 while lowering first holder 12(A). Also, when performing raising operation of last holder 12(L), because the component pickup and mounting operations of first holder 12(A) which is the adjacent holder to last holder 12(L) are already complete, it is not necessary to rotate rotary head 11.

Control device 43 (refer to FIG. 8) of the component mounter which is configured mainly from a computer, according to a production program, controls head moving device 20, R-axis motor 25 of head holding unit 21, Q-axis motor 28, Z-axis motor 37, and so on, controls picking up components supplied from feeders 44 set on the component mounter by the multiple suction nozzles 13 of rotary head 11 and mounting the components on a circuit board, and controls operation for holding rotary head 11 loaded on the head loading section by head holding unit 21, releasing operation of rotary head 11 from head holding unit 21, and so on.

When loading rotary head 11 on the head loading section, the rotary head 11 is loaded such that the wide interval between lever engaging piece 39(A) of first holder 12(A) and lever engaging piece 39(L) of last holder 12(L) is positioned to correspond to Z-axis lever 52 of Z-axis driving mechanism 51 of the component mounter. When holding rotary head 11 loaded on the head loading section by head holding section 21, control device 43 of the component mounter moves head holding unit 21 above the rotary head 11 loaded on the head loading section using head moving device 20, such that Z-axis lever 52 of Z-axis driving mechanism 51 is positioned directly above the wide interval between lever engaging piece 39(A) of first holder 12(A) and lever engaging piece 39(L) of last holder 12(L) of the rotary head 11 loaded on the head loading section.

Then, head holding unit 21 is lowered by head moving device 20 such that R axis 22 is inserted into cylindrical gear 33 of the rotary head 11 loaded on the head loading section, and the uneven portions of ring-shaped clutch member 61 of Q-axis gear 27 and the uneven portions of ring-shaped clutch member 62 of cylindrical gear 33 engage with each other such that rotation is transferable between them. By this lowering operation of head holding unit 21, Z-axis lever 52 of Z-axis driving mechanism 51 passes through the wide interval between lever engaging piece 39(A) of first holder 12(A) and lever engaging piece 39(L) of last holder 12(L) of rotary head 11 loaded on the head loading section, such that a horizontal claw section on the lower end of Z-axis lever 52 is lowered to a position slightly lower than the height of the lower surface of lever engaging pieces 39(A) and 39(L), and pushing down roller 54 is lowered to a position slightly higher than the height of the upper surface of lever engaging pieces 39(A) and 39(L). Further, by the above lowering operation of head holding unit 21, each engaging member 31 of R axis 22 is inserted into each engaging hole 35 of rotary head 11. Then, after engaging each engaging member 31 with the end section of each engaging hole 35 by rotating R axis 22 just a little using R-axis motor 25, each engaging member 31 is raised by an air cylinder (not shown) such that an engaged state is maintained. By this, rotary head 11 is attached to R axis 22.

Figure 6:
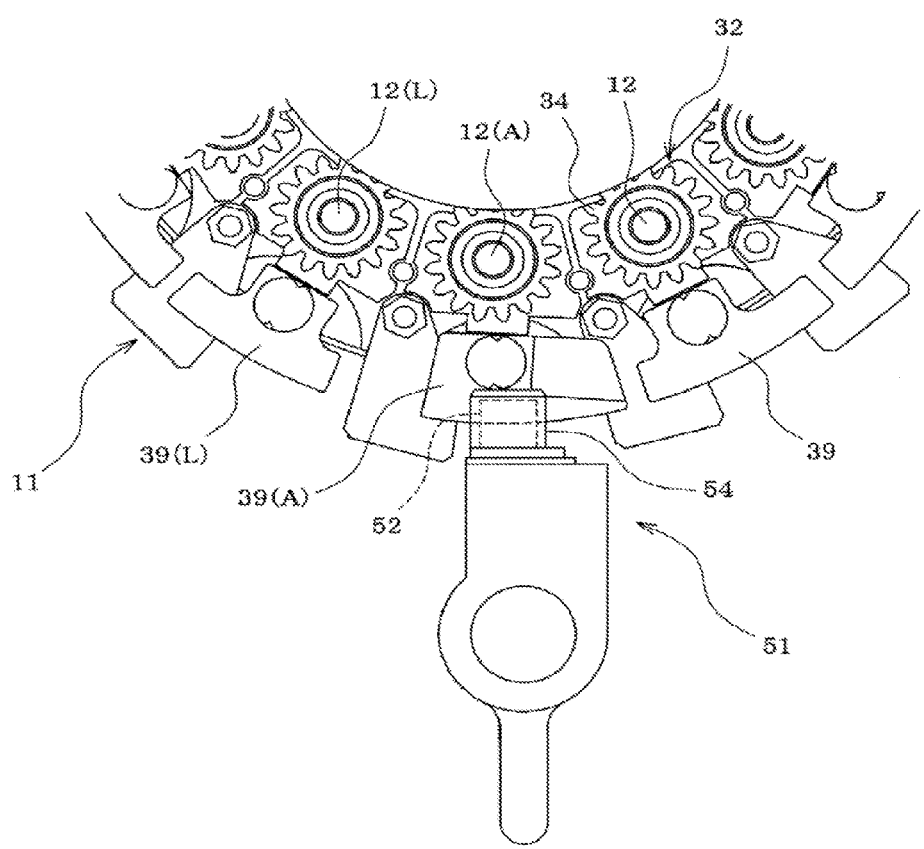
FIG. 6 is a plan view showing the state of the Z-axis driving mechanism during component pickup and mounting operations.

Then, when holding a component on each of the multiple suction nozzles 13 held on the multiple nozzle holders 12 of rotary head 11, control device 43 of the component mounter moves rotary head 11 in the XY direction (horizontal direction) towards a point above the component pickup position using head moving device 20, and during that moving process, rotates R axis 22 such that rotary head 11 rotates, and as shown in FIG. 6, first holder 12(A) moves to a position corresponding to pushing down roller 54 of Z-axis driving mechanism 51 (that is, a position at which lever engaging piece 39(A) of first holder 12(A) is inserted between pushing down roller 54 and Z-axis lever 52), and stops the rotation of rotary head 11.

Then, pushing down roller 54 and Z-axis lever 52 of Z-axis driving mechanism 51 are lowered such that first holder 12(A) is pushed down against the pushing up force of spring 40, suction nozzle 13 held by first holder 12(A) is lowered, and at the lowest point, the suction nozzle 13 picks up a component supplied from feeder 44.

After component pickup, pushing down roller 54 and Z-axis lever 52 of Z-axis driving mechanism 51 are raised to their original heights, suction nozzle 13 of first holder 12(A) is raised, and overlapping with that raising operation, rotary head 11 is rotated by R axis 22 such that lever engaging piece 39(A) of first holder 12(A), which is positioned between pushing down roller 54 and Z-axis lever 52, is moved, and rotary head 11 is rotated to a position at which an end of lever engaging piece 39(A) of first holder 12(A) is inserted between pushing down roller 54 and Z-axis lever 52.

Also, at the point when first holder 12(A) has been raised to its original height (upper limit position), rotary head 11 is rotated further, and at the point when an end of lever engaging piece 39 of the second nozzle holder 12 is inserted between pushing down roller 54 and Z-axis lever 52 of Z-axis driving mechanism 51, pushing down roller 54 and Z-axis lever 52 of Z-axis driving mechanism 51 are lowered such that the second nozzle holder 12 is pushed down, thereby lowering suction nozzle 13 held on the second nozzle holder 12. Overlapping with this lowering operation, rotary head 11 is rotated by R axis 22, suction nozzle 13 of the second nozzle holder 12 is moved to the component pickup position and the rotation of rotary head 11 is stopped by the time suction nozzle 13 of the second nozzle holder 12 has been lowered to the lowest point.

After that, at the point when suction nozzle 13 of the second nozzle holder 12 has been lowered to the lowest point, after a component has been picked up by the suction nozzle 13, pushing down roller 54 and Z-axis lever 52 of Z-axis driving mechanism 51 are raised to their original height, suction nozzle 13 of the second nozzle holder 12 is raised, and overlapping with that raising operation, rotary head 11 is rotated such that lever engaging piece 39 of the second nozzle holder 12, which is inserted between pushing down roller 54 and Z-axis lever 52, is moved, and rotary head 11 is rotated to a position at which an end of lever engaging piece 39 of the second nozzle holder 12 is inserted between pushing down roller 54 and Z-axis lever 52.

Also, at the point when the second nozzle holder 12 has been raised to its original height (upper limit position), rotary head 11 is rotated further, and the process continues to component pickup operation of the third nozzle holder 12, with operation being performed in the same way as the above component pickup operation of the second nozzle holder 12, such that a component is picked up by suction nozzle 13 of the third nozzle holder 12 and then the nozzle holder is raised to its original height (upper limit position).

Thereafter, component pickup operation for the fourth nozzle holder 12 and onwards is performed in the same way. And, lowering operation of last holder 12(L) and rotating operation of rotary head 11 overlap, and after a component has been picked up by suction nozzle 13 of last holder 12(L), last holder 12(L) is raised to its original height (upper limit position). When performing this raising operation of last holder 12(L), rotation of rotary head 11 is stopped and overlapping operation is not performed.

After that, in a process of moving rotary head 11 in the XY direction (horizontal direction) towards a point above the circuit board, rotary head 11 is rotated such that first holder 12(A) is moved to a point at which first holder 12(A) is lowered by Z-axis driving mechanism 51. Thereafter, in a similar way as with the above component pickup operation, the component is mounted on the circuit board by performing overlapping of the lowering and raising operations of nozzle holder 12 in order from first holder 12(A), and rotating operation of rotary head 11. When raising last holder 12(L) after lowering last holder 12(L) and mounting the component, the rotation of rotary head 11 is stopped such that overlapping operation is not performed. Then, at the point when raising operation of last holder 12(L) has been completed, rotary head 11 is moved in the XY direction towards a point above the component pickup position, and during that moving process, rotary head 11 is rotated such that first holder 12(A) is moved to a point at which first holder 12(A) is lowered by Z-axis driving mechanism 51. Thereafter, the above pickup operation is performed in order from first holder 12(A).

Figure 7:
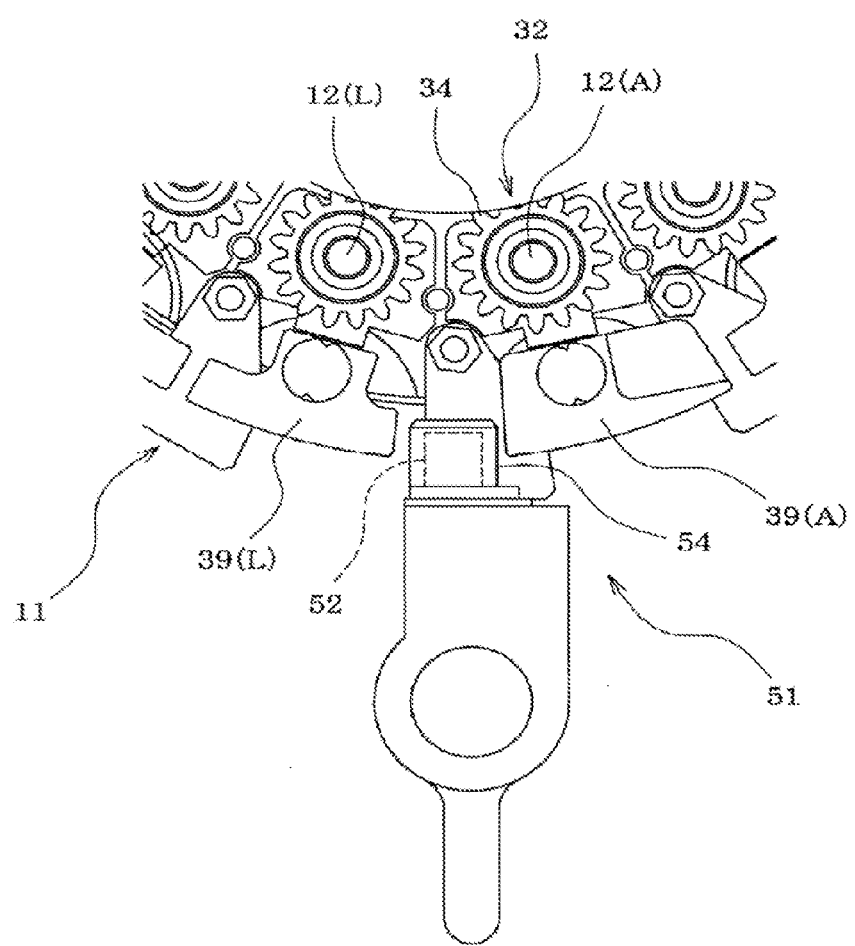
FIG. 7 is a plan view showing the state of the Z-axis driving mechanism during attachment/removal of the rotary head.

After that, when removing rotary head 11 from head holding unit 21, in the process in which rotary head 11 is moved towards a point above the head loading section, rotary head 11 is rotated such that, as shown in FIG. 7, the wide interval between lever engaging piece 39(A) of first holder 12(A) and lever engaging piece 39(L) of last holder 12(L) is positioned to correspond to Z-axis lever 52 of Z-axis driving mechanism 51, then rotation of rotary head 11 is stopped. After that, rotary head 11 is loaded onto an empty space on the head loading section, the engagement of engaging holes 35 and engaging members 31 of R axis 22 is released and head holding unit 21 is raised straight up. Here, Z-axis lever 52 of Z-axis driving mechanism 51 passes through the wide interval between lever engaging piece 39(A) of first holder 12(A) and lever engaging piece 39(L) of last holder 12(L), and Z-axis lever 52 is separated without interfering with lever engaging piece 39. By this, rotary head 11 is removed from head holding unit 21 and loaded on the head holding section.

According to the above embodiment, because rotary head 11 is rotated by a predetermined angle each time component pickup and mounting operations are performed such that the multiple nozzle holders 12 are raised/lowered by Z-axis driving mechanism 51 in the order in which they are arranged, unlike with patent literature 1, it is not necessary to raise/lower rotary head 11 when performing component pickup and mounting operations. Further, except for the interval between lever engaging piece 39(A) of first holder 12(A) and lever engaging piece 39(L) of last holder 12(L), the intervals between lever engaging piece 39 of each nozzle holder 12 are set at a narrow interval at which the engagement of lever engaging piece 39 with Z-axis lever 52 and pushing down roller 54 is not released, thus during component pickup and mounter operations the lowering and raising operations of nozzle holders 12 by Z-axis driving mechanism 51 and the rotating operation of rotary head 11 by R-axis driving mechanism 23 can overlap. By this, compared to a case in which the lowering and raising operations of nozzle holder 12 and the rotating operation of rotary head 11 do not overlap, the time interval between the raising and lowering operations of each nozzle holder 12 is shortened, and it is possible to support faster component pickup and mounting operations. Also, because the interval between lever engaging piece 39(A) of first holder 12(A) and lever engaging piece 39(L) of last holder 12(L) is set at a wide interval at which engagement with Z-axis lever 52 is released, by using the wide interval between lever engaging piece 39(A) of first holder 12(A) and lever engaging piece 39(L) of last holder 12(L) as a passage through which Z-axis lever 52 passes in an up/down direction when rotary head 11 is attached/removed to/from the head holding unit, rotary head 11 can be attached/removed quickly without the need to move Z-axis lever 52 to a position where Z-axis lever 52 does not interfere with lever engaging piece 39. Further, because a mechanism that moves Z-axis lever 52 to a position where the Z-axis lever 52 does not interfere with lever engaging piece 39 is not required, there is a benefit that the configuration is not made more complex, and the demand for low costs can be satisfied.

Further, in the present embodiment, because the pushing down member that pushes does lever engaging piece 39 of nozzle holder 12 during component pickup and mounting operations is configured from pushing down roller 54, the friction between pushing down roller 54 and lever engaging piece 39 during overlapping operation is greatly reduced, and as well as allowing smooth overlapping operation, there is a benefit that durability is improved.

However, the present disclosure is not limited to a configuration using pushing down roller 54, and it goes without saying that the friction may be reduced by using any easily-sliding member for which the friction between the pushing down member and lever engaging piece 39 is small.

Also, in the present embodiment, pushing down roller 54 and Z-axis lever 52 are engaged with lever engaging piece 39 by lowering Z-axis driving mechanism 51 by the lowering operation of head holding unit 21 when attaching rotary head 11 to R axis 22 of head holding unit 21, but roller 54 and Z-axis lever 52 may be engaged with lever engaging piece 39 by lowering Z-axis driving mechanism 51 after rotary head 11 has been attached to R axis 22 of head holding unit 21.

Also, the present disclosure is not limited to the above embodiment, and various embodiments with changes that do not extend beyond the scope of the disclosure are possible such as it is acceptable to appropriately change, for example, the configuration of rotary head 11 engaged and held in head holding unit 21, the configuration of suction nozzle 13 engaged and held in nozzle holder 12, or the quantity of nozzle holders 12 held on rotary head 11.

REFERENCE SIGNS LIST

10: component pickup/mounting device; 11: rotary head; 12: nozzle holder; 12(A): first holder; 12(L): last holder; 13: suction nozzle; 20: head moving device; 21: head holding unit; 22: R axis; 23: R-axis driving mechanism (head rotating driving mechanism); 24: R-axis gear; 25: R-axis motor; 26: Q-axis driving mechanism (nozzle rotating driving mechanism); 27: Q-axis gear; 28: Q-axis motor; 31: engaging member; 32: nozzle rotating gear mechanism: 33: cylindrical gear; 34: small gear; 35: engaging hole; 37: Z-axis motor; 39: lever engaging piece; 40: spring (spring member); 43: control device; 44: feeder; 51: Z-axis driving mechanism; 52: Z-axis lever; 54: pushing down roller (pushing down member)

The invention claimed is:

1. A component mounter comprising:
   a rotary head to which multiple nozzle holders that hold multiple suction nozzles which pick up a component are attached at predetermined intervals in a circumferential direction so as to be lowerable;
   a head holding unit that exchangeably holds the rotary head;
   a head moving device that moves the head holding unit;
   an R-axis driving mechanism, provided on the head holding unit, that revolves the multiple nozzle holders and the multiple suction nozzles together in a circumferential direction of the rotary head by rotating the rotary head;
   a lever engaging piece provided on each of the multiple nozzle holders; and
   a Z-axis driving mechanism that lowers and raises the suction nozzle held on the nozzle holder by lowering and raising the nozzle holder by engaging the lever engaging piece of, from among the multiple nozzle holders, the nozzle holder that is to perform component pickup and mounting operation from above and below with a pushing down member and a Z-axis lever;
   wherein the rotary head is rotated a predetermined angle each time by the R-axis driving mechanism so as to perform component pickup and mounting operations by lowering and raising the multiple nozzle holders in the order in which the nozzle holders are arranged using the Z-axis driving mechanism, the interval between the lever engaging piece of a first holder which is the nozzle holder which performs component pickup and mounting operations first and the lever engaging piece of a last holder which is the nozzle holder which performs component pickup and mounting operations last is set at an interval at which engagement with the Z-axis lever is released, and the interval between the lever engaging piece of the first holder and the lever engaging piece of the last holder is used as a passage through which the Z-axis lever passes in an up and down direction when the rotary head is attached to and removed from the head holding unit,
   wherein, except for the interval between the lever engaging piece of the first holder and the lever engaging piece of the last holder, the intervals between the lever engaging piece of each of the nozzle holders are set at an interval at which the engagement of the lever engaging piece with the Z-axis lever and the pushing down member is not released, and during component pickup and mounting operations the lowering and raising operations of the nozzle holder by the Z-axis driving mechanism and the rotating operation of the rotary head by the R-axis driving mechanism overlap,
   wherein the pushing down member is a roller member, and wherein a location where the Z-axis lever holds the roller member is disposed at a greater radial location than the roller member.

2. The component mounter according to claim 1, wherein rotation of the rotary head is stopped when performing lowering operation of the first holder and raising operation of the last holder.

\* \* \* \* \*